(12) United States Patent
Charest et al.

(10) Patent No.: US 6,860,028 B2
(45) Date of Patent: Mar. 1, 2005

(54) ALIGNMENT DEVICE AND METHOD OF CONNECTING A CIRCUIT CARD TO A MID PLANE

(75) Inventors: Glenn P. Charest, San Jose, CA (US); William L. Grouell, San Ramon, CA (US); John A. Harada, San Francisco, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/427,497

(22) Filed: Apr. 30, 2003

(65) Prior Publication Data

US 2004/0216318 A1 Nov. 4, 2004

(51) Int. Cl.[7] .................................................. G02B 6/36
(52) U.S. Cl. ............................................ 33/645; 385/52
(58) Field of Search ........................... 33/613, 645, 533, 33/520, 644; 385/52

(56) References Cited

U.S. PATENT DOCUMENTS

| | | | | |
|---|---|---|---|---|
| 5,091,991 A | * | 2/1992 | Briggs et al. ................. 385/82 |
| 5,325,451 A | * | 6/1994 | Hartman et al. ............... 385/49 |
| 6,118,917 A | * | 9/2000 | Lee et al. ...................... 385/49 |
| 6,227,722 B1 | * | 5/2001 | Kropp .......................... 385/88 |
| 6,405,447 B2 | * | 6/2002 | Nyen ........................... 33/645 |
| 6,450,704 B1 | * | 9/2002 | O'Connor et al. ............ 385/92 |
| 6,493,489 B2 | * | 12/2002 | Mertz et al. ................... 385/52 |
| 6,526,206 B2 | * | 2/2003 | Kunkel et al. ................. 385/52 |

* cited by examiner

Primary Examiner—Christopher W. Fulton
(74) Attorney, Agent, or Firm—Martine & Penilla LLP

(57) ABSTRACT

An alignment device includes a crossbar and two brackets. Each one of the two brackets includes at least one guide hole, with each guide hole having a front opening. The crossbar couples the two brackets and defines a connector opening. The alignment device also includes two connector alignment posts. Each one of the two connector alignment posts has a first end coupled to the crossbar and an opposing end protruding into the connector opening. A method of connecting a circuit card to a mid plane and a computer including the alignment device also are described.

17 Claims, 15 Drawing Sheets

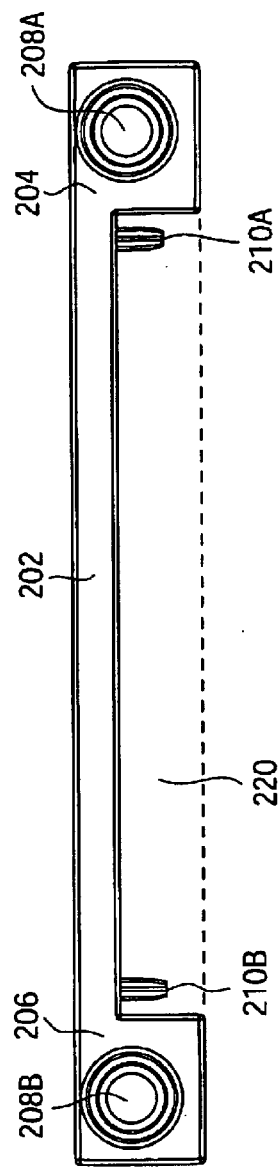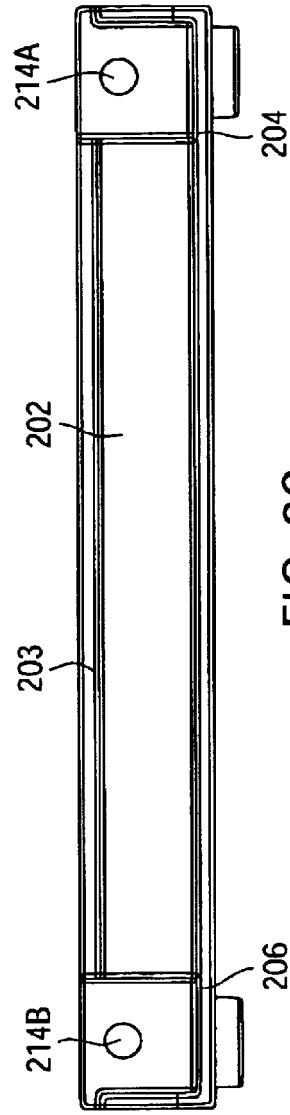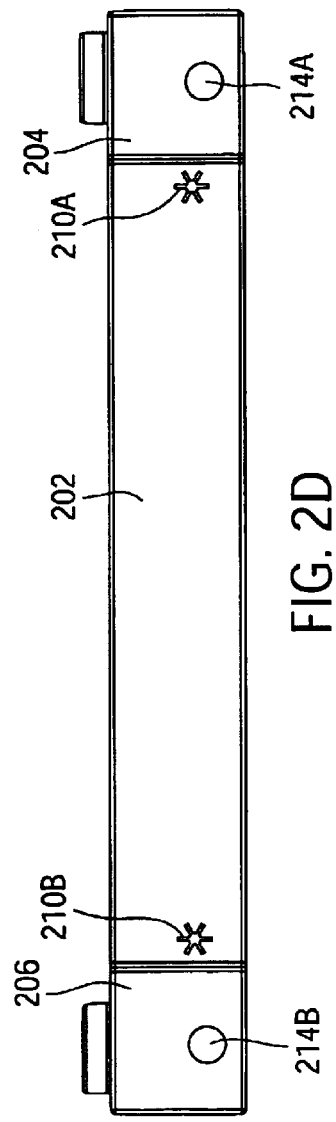

ALIGNMENT DEVICE AND METHOD OF CONNECTING A CIRCUIT CARD TO A MID PLANE

BACKGROUND OF THE INVENTION

1. Field of the Invention

The present invention relates generally to electrical connectors and, more particularly, to systems, methods, and apparatus for blind alignment of an electrical connector.

2. Description of the Related Art

Electrical connectors are often used in blind connection locations such as on the backside of an electrical device (e.g., circuit card, computer, hard drive, etc.) that will be connected to a back plane or mid plane of a mounting device as the electrical device is inserted into the mounting device. FIG. 1 shows a typical example of a blind electrical connection 100. The electrical device 102 includes an electrical connector 106. A mount 104 is designed to hold the electrical device 102. The mount 104 includes an electrical receptacle 108 located in a back plane of the mount. The receptacle 108 will mate to the electrical connector 106. The electrical connector 106 includes multiple electrical "male" pins and the electrical receptacle 108 includes an electrical "female" receptacle that corresponds to each one of the multiple male pins. As the electrical device 102 is inserted into the mount 104, the mount approximately aligns the electrical connector 106 with the electrical receptacle 108. As the electrical device 102 is fully engaged in the mount 104, the connector 106 and the receptacle 108 also fully engage. When the connector 106 and the receptacle 108 fully engage, the male pins within the connector 106 and the female receptacles within the receptacle 108 are engaged, thereby establishing the necessary electrical connections between the electrical device 102 and the mount 104. A blind electrical connection can be used in many applications such as, for example, in rack-mounted equipment (e.g., computers, etc.) or for connecting a circuit card or hard drive to a mid plane in a server chassis.

Computers and other electrical equipment are under constant improvement and modification. Often the interfacing connectors (e.g., blind electrical connections) are defined by an industry standard or for legacy reasons and therefore cannot be easily modified or updated. If a new chassis design includes a circuit card that has a legacy interfacing blind connector, then such blind connector may not be ideal for the new chassis. For example, the new chassis may be a conversion of a rack mounted design to a more ruggedized mobile, rack mounted design. As a result, manufacturing tolerances can change, the weight and sizes of circuit cards and their ruggedized reinforcing structures can increase, and other changes can occur. As a result, the legacy connector and corresponding receptacle may not align well, resulting in bent and shorted pins, difficulty in installing the circuit card, poor reliability due to lateral stresses caused by the increased weight, and other problems. While the legacy connector is no longer the ideal physical connection it does still preserve the desired legacy electrical interface.

In some instances, a new connector that includes alignment pins and more rugged construction may be designed to replace the legacy connector. However, designing the new connector can be very expensive, very time consuming, and may not be financially feasible in many circumstances (e.g., limited production run, etc.).

In view of the foregoing, there is a need for a system and method for improving an existing blind electrical connector without requiring replacement of the entire electrical connector or the design and qualification of a new electrical connector.

SUMMARY OF THE INVENTION

Broadly speaking, the present invention fills these needs by providing an alignment device that may be added to an existing connector. It should be appreciated that the present invention can be implemented in numerous ways, including as a process, an apparatus, a system, or a device. Several exemplary embodiments of the present invention are described below.

In accordance with one aspect of the invention, an alignment device is provided. The alignment device includes a crossbar and two brackets. Each one of the two brackets includes at least one guide hole, with each guide hole having a front opening. The crossbar couples the two brackets and defines a connector opening. In one embodiment, the connector opening is defined between the two brackets. The alignment device also includes two connector alignment posts. Each one of the two connector alignment posts has a first end coupled to the crossbar and an opposing end protruding into the connector opening. In one embodiment, the crossbar includes at least one longitudinal reinforcement web. Each guide hole can be a self-centering guide hole.

In one embodiment, each guide hole includes at least three ribs that are substantially evenly distributed around an interior circumference of the guide hole. In one embodiment, the at least three ribs are deformable as a guide pin is inserted into the guide hole. In one embodiment, the front opening of the guide hole includes a tapered section. In one embodiment, the front opening of each of the guide holes is for receiving a corresponding guide pin. A self-centering guide pin capable of engaging the guide hole can also be included. The self-centering guide pin can include multiple centering ribs along the length of the self-centering guide pin.

Each of the connector alignment posts can include a locking mechanism for engaging the alignment device to a connector. Each of the connector alignment posts engages a corresponding alignment hole in a connector. In one embodiment, each of the connector alignment posts has a tapered shape such that the first end has a larger diameter and the opposing end has a smaller diameter. In one embodiment, each of the connector alignment posts includes three or more longitudinal ribs extending lengthwise along the connector alignment post, with the three longitudinal ribs being substantially evenly distributed around the connector alignment post. In one embodiment, each of the three longitudinal ribs is deformable as the connector alignment post engages a corresponding alignment hole in the connector.

In one embodiment, each one of the two brackets includes a mounting surface for securing the alignment device to a substrate, e.g., a circuit card. The mounting surface can include one or more mounting holes capable of receiving a fastener to secure the alignment device to the substrate. In one embodiment, the one or more mounting holes are oriented perpendicularly to the guide holes. In one embodiment, the guide holes are oriented in parallel with a top surface of the substrate.

In accordance with another aspect of the invention, a method of connecting a circuit card to a mid plane is provided. In this method, a connector, which is electrically coupled to the circuit card, is located in an alignment device, which is physically coupled to the circuit card. Two mid plane guide pins are captured in the alignment device, and the connector is connected to a corresponding receptacle in the mid plane. The connector alignment posts can lock the connector to the alignment post.

In one embodiment, locating the connector in the alignment device includes engaging at least one connector alignment post in a corresponding alignment hole in the connector. The connector can be an electrical connector that includes multiple electrical contacts and the receptacle can include multiple corresponding receptacle electrical contacts.

In one embodiment, capturing the two mid plane guide pins in the alignment device includes inserting a first end of each one of the two guide pins in a corresponding guide hole. In one embodiment, capturing the two mid plane guide pins in the alignment device includes centering the two guide pins in the alignment device as the guide pins are inserted into the alignment device. In one embodiment, centering the two mid plane guide pins in the alignment device includes deforming a plurality of centering ribs in the guide hole.

In accordance with yet another aspect of the invention, a computer is provided. The computer includes a circuit card, a connector, an alignment device for locating the connector to the circuit card, and a mid plane. The alignment device includes the features described above. The mid plane includes a receptacle corresponding to the connector and two guide pins corresponding to the two guide pin holes.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

FIGS. 2A–2D show an alignment device in accordance with one embodiment of the present invention.

DETAILED DESCRIPTION OF THE EXEMPLARY EMBODIMENTS

Figure 1:
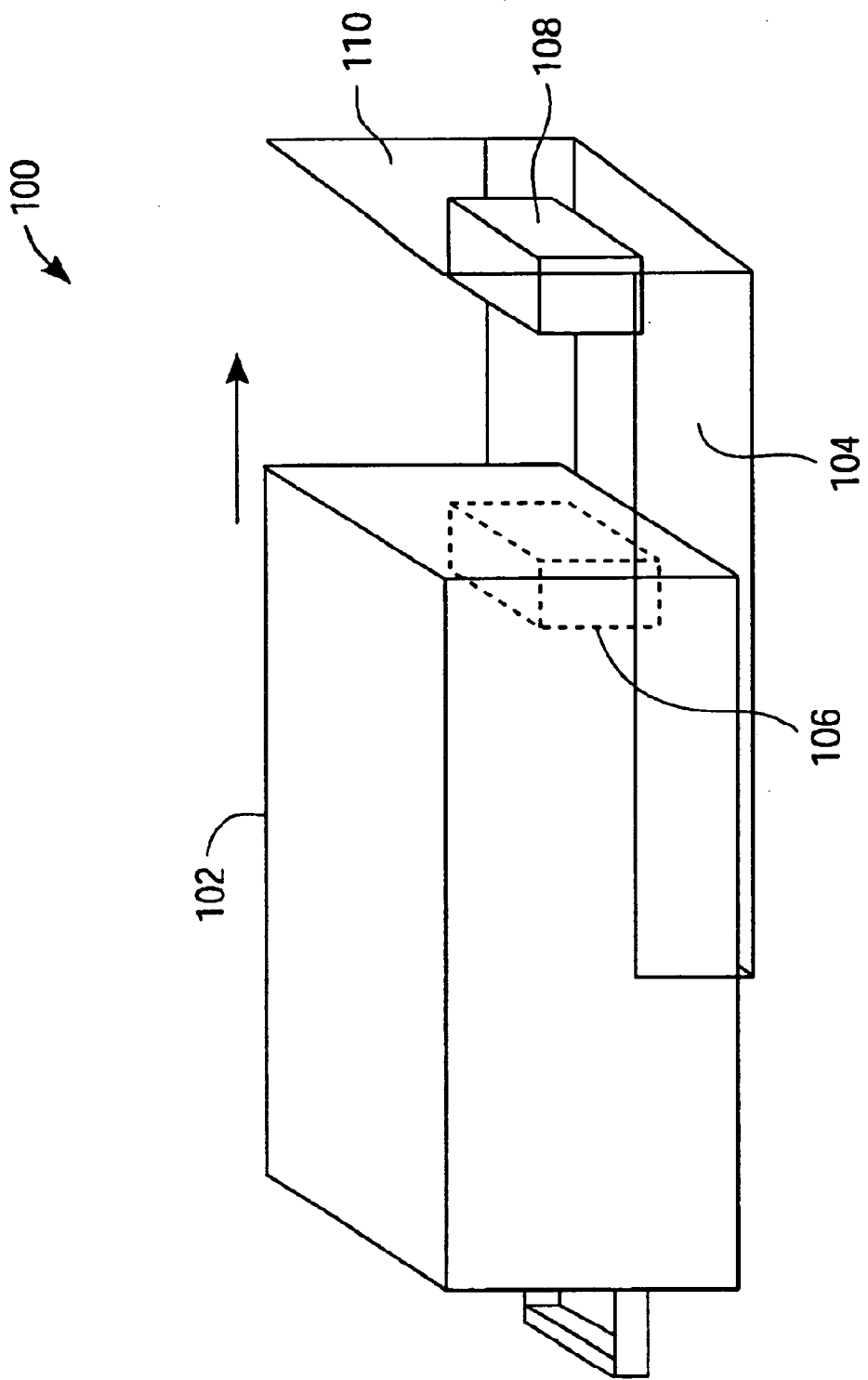
FIG. 1 shows a typical example of a blind electrical connection.
Figure 2A:
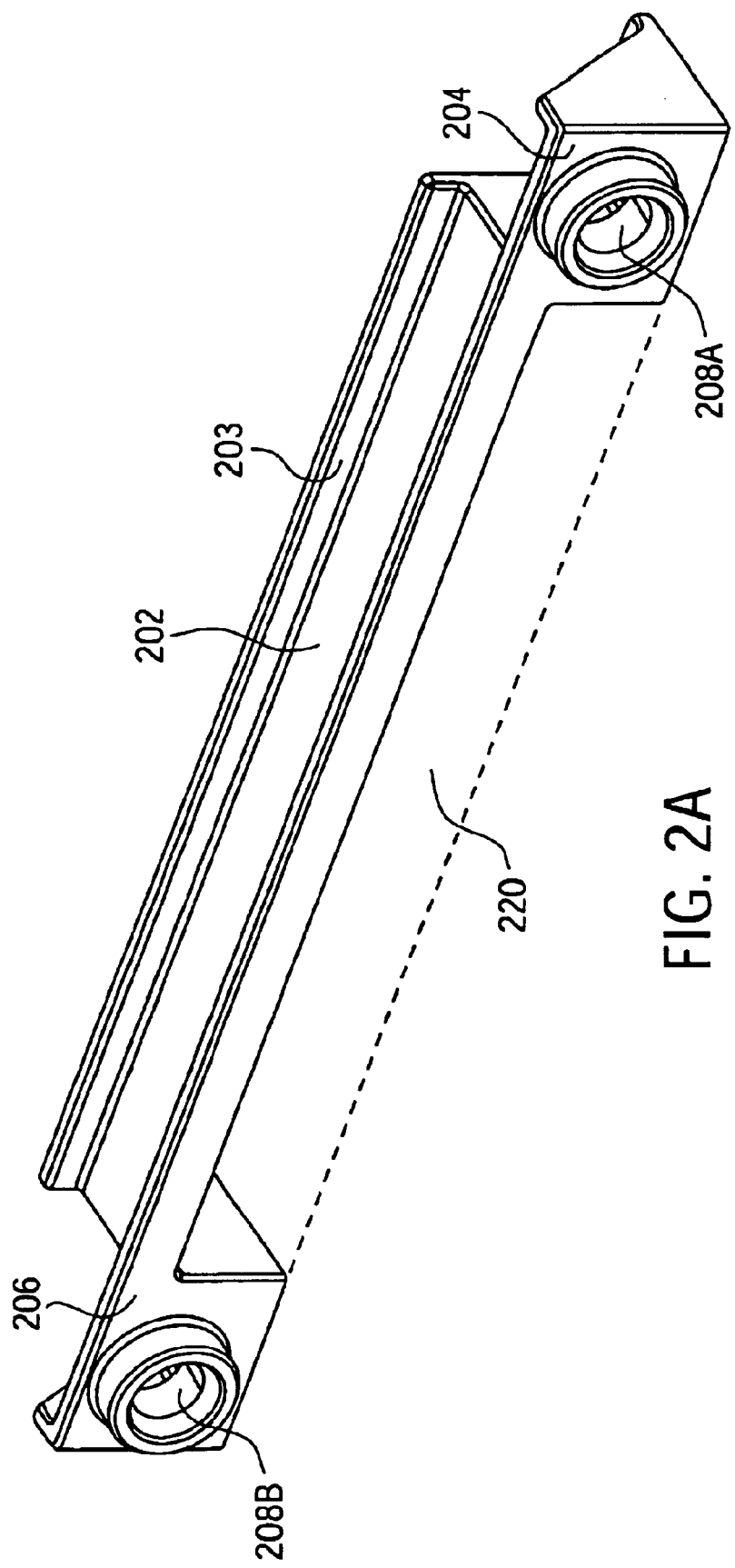

Several exemplary embodiments for a system and method for improving alignment of an existing electrical connector and receptacle will now be described. It will be apparent to those skilled in the art that the present invention may be practiced without some or all of the specific details set forth herein.

Electrical equipment is constantly being improved and modified. Often interfacing connectors cannot be changed due to legacy reasons. By way of example, the legacy reasons can relate to engineering concerns such as precise impedance matches of the connector and receptacle that may require extensive testing and redesign of any replacement connector. Typically, the design and improvement cycle time for electrical devices, especially computer-related electrical devices, is very rapid. As a result, there often is not sufficient time to design, test, and approve an improved, replacement connector. The present invention provides an alignment device that can be added to a legacy connector to improve the alignment of the legacy connector and thereby avoid redesigning and replacing such connector.

FIGS. 2A–2D show an alignment device 200 in accordance with one embodiment of the present invention. Referring to the three-dimensional view and the front view shown in FIGS. 2A and 2B, respectively, the alignment device 200 includes a crossbar 202 that connects two brackets 204, 206 to frame a connector opening 220. Each one of the two brackets 204, 206 includes respective guide holes 208A, 208B.

Referring to FIG. 2B and the bottom view shown in FIG. 2D, the alignment device 200 can also include two connector alignment posts 210A, 210B. The connector alignment posts 210A, 210B are coupled to the crossbar 202 at one end and extend into the connector opening 220. The alignment device 200 can also include more than one crossbar. As shown in the top view of FIG. 2C, the crossbar 202 can also include one or more reinforcing webs 203 to increase strength and stiffness of the alignment device 200.

The alignment device 200 can be manufactured from materials such as a plastic, a glass-filled material, a metal, a polycarbonate material, or any other suitable material. The alignment device can be manufactured by any suitable manufacturing process, e.g., a machining process, a casting process, a stamping process, or a molding process.

Figure 3:
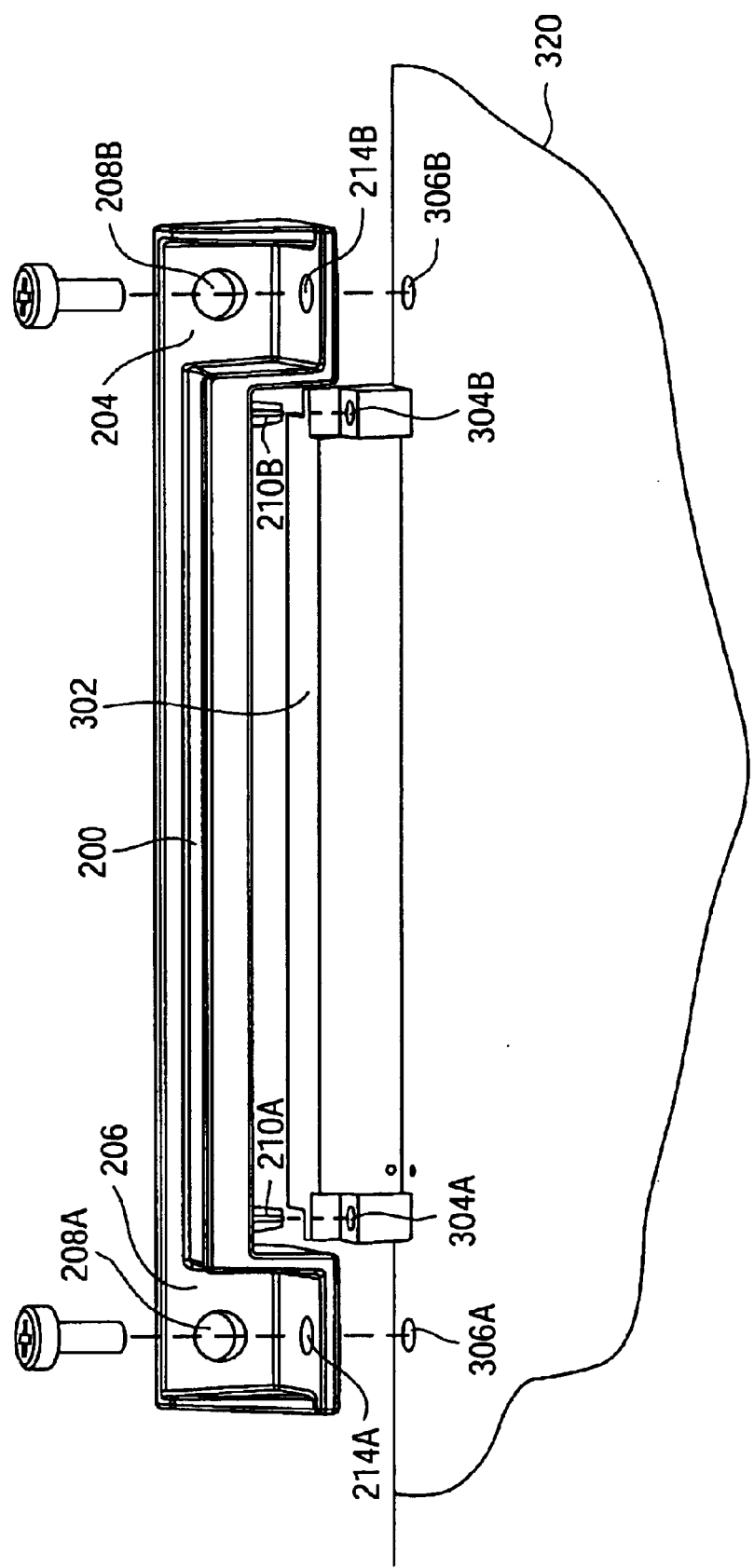
FIG. 3 shows a three-dimensional view of the alignment device and an electrical connector in accordance with one embodiment of the present invention.

FIG. 3 shows a three-dimensional view of the alignment device 200 and an electrical connector 302 in accordance with one embodiment of the present invention. The connector alignment posts 210A, 210B are aligned to corresponding connector alignment holes 304A, 304B in the electrical connector 302. Mating the alignment posts 210A, 210B to the corresponding connector alignment holes 304A, 304B securely locates the electrical connector 302 to the alignment device 200. Both the electrical connector 302 and the alignment device 200 can also be coupled to a substrate 320 (e.g., a circuit card) through mounting holes 214A, 214B, 306A, and 306B. The alignment posts 210A, 210B locate the electrical connector 302 within the alignment device 200 more precisely than the mounting holes 214A, 214B, 306A, and 306B can locate the electrical connector 302 within the alignment device 200 without the alignment posts. As will be described in more detail below, precise alignment of the electrical connector 302 in the alignment device 200 is important to ensure accurate alignment of the electrical connector 302 with a corresponding receptacle.

While FIG. 3 shows that the mounting holes 214A, 214B are perpendicular to guide holes 208A, 208B, it should be understood that the mounting holes can be in any orientation to securely mount the alignment device 200 to one or both of the connector 302 and the substrate so long as the connector is located accurately to the alignment device. For example, in one embodiment, the alignment posts 210A, 210B can be fasteners that attach and locate the alignment device 200 to the connector 302. The fasteners can also pass through the connector 302 and perform both fastening and locating functions between the alignment device 200, the connector, and substrate 320. It should be understood that more or less than two mounting holes could be included.

Figure 4:
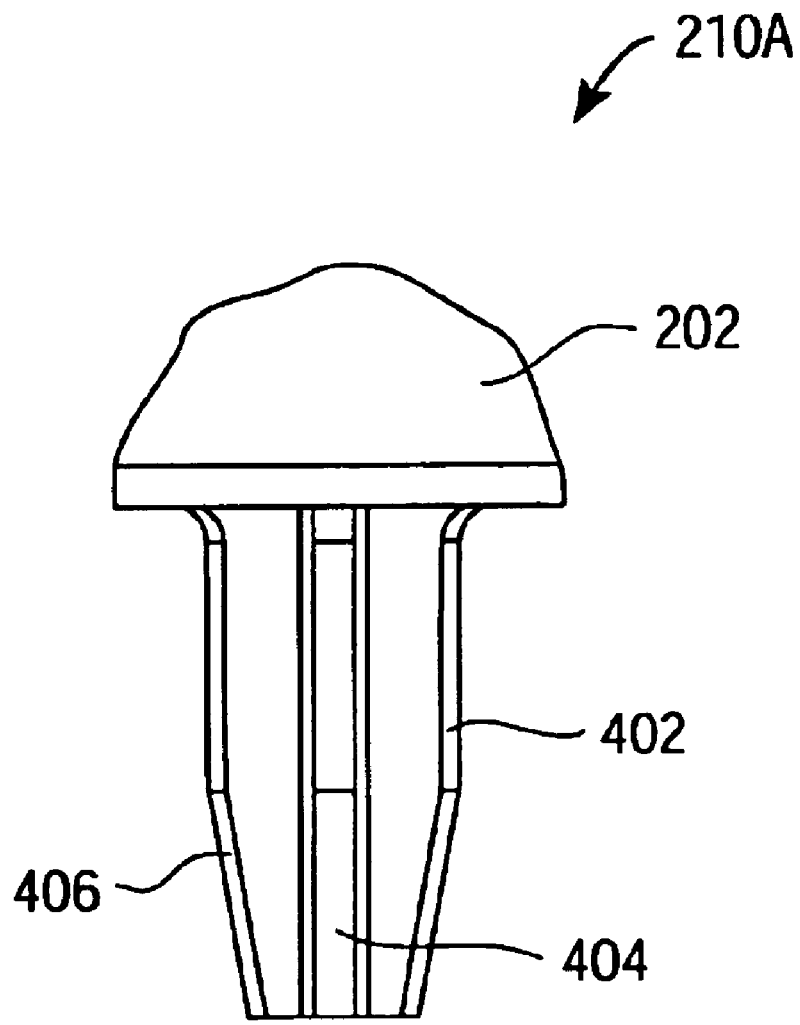
FIG. 4 shows a detailed view of the alignment post, in accordance with one embodiment of the present invention.

FIG. 4 shows a detailed view of the alignment post 210A in accordance with one embodiment of the present invention. The alignment post 210A has a generally tapered shape so as to automatically center the alignment post in the corresponding alignment hole 304A as the alignment post is inserted into the alignment hole. The alignment post 210A can also include at least three longitudinal ribs 402, 404, 406 that are equally spaced around the circumference of the alignment post. It should be understood that more or less than three longitudinal ribs could be included. By way of example, six longitudinal ribs could be included on each alignment post. The longitudinal ribs 402, 404, 406 can also be tapered so as to self-center the alignment post 210A in the corresponding alignment hole 304A as the alignment post is inserted into the alignment hole.

If desired, the longitudinal ribs 402, 404, 406 can be deformable so that the longitudinal ribs are partially crushed or deformed as the alignment post 210A is inserted into the alignment hole 304A. The longitudinal ribs 402, 404, 406 can be deformed if the inside diameter of the alignment hole 304A is less than the width of the alignment post 210A having longitudinal ribs 402, 404, 406. Deforming the longitudinal ribs 402, 404, 406 can more securely locate the connector 302 to the alignment device 200 by providing a friction fit. An alignment post 210A having crushable longitudinal ribs 402, 404 and 406 is intended to be inserted only once into the connector alignment hole 304A so that the longitudinal ribs can be crushed to match the interior circumference of the alignment hole.

In alternative embodiments, the alignment posts 210A, 210B can be replaced with any structure that will securely (e.g., lock) and accurately locate the connector 302 to the alignment device 200. By way of example, the alignment device 200 can be bonded to the connector 302 with an adhesive or a bolt or other suitable fastening or locking system. In another example, intermeshing structures such as, for example, teeth or other surface structures, can be provided between the alignment device 200 and the connector 302.

Figure 5B:
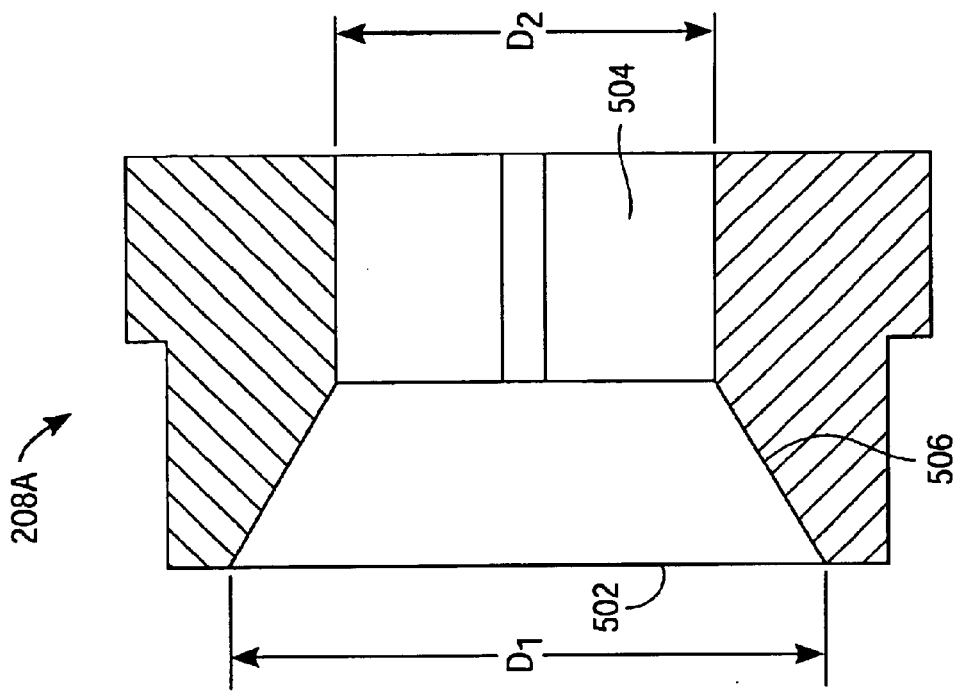
FIGS. 5A and 5B show detailed views of the guide hole, in accordance with one embodiment of the present invention.
Figure 5A:
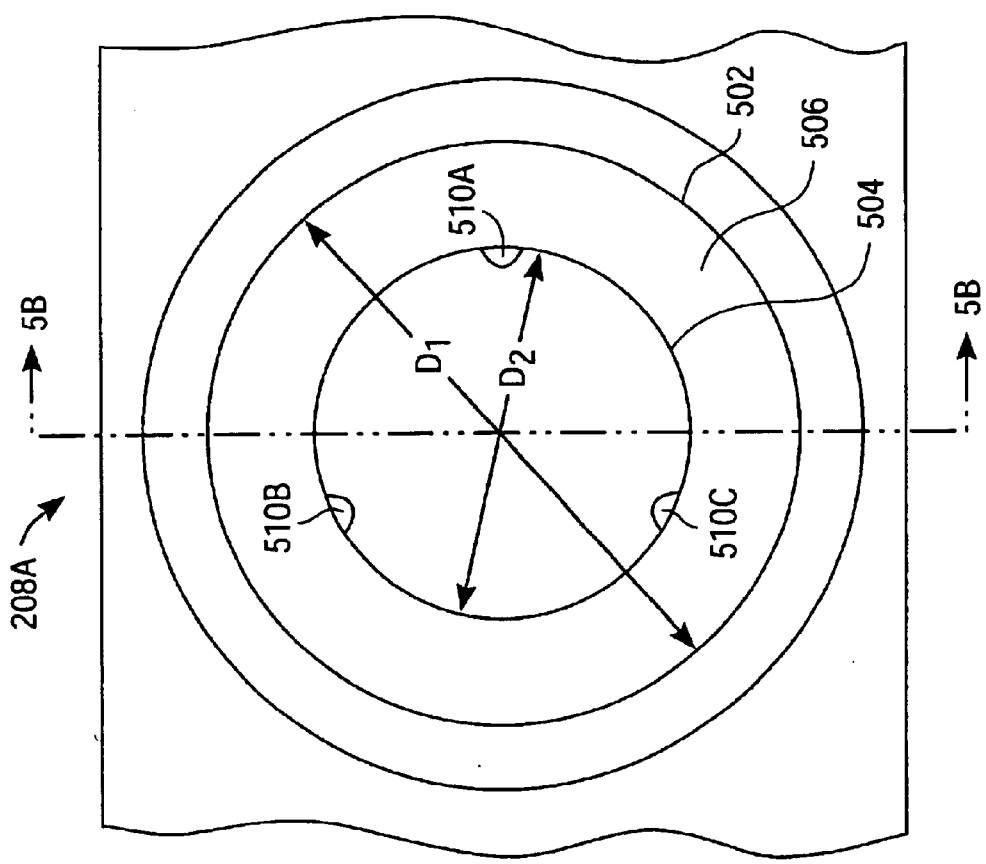

FIGS. 5A and 5B show detailed views of the guide hole 208A in accordance with one embodiment of the present invention. FIG. 5A shows a front view of the guide hole 208A and FIG. 5B shows a section view 5B—5B of the guide hole. The guide hole 208A has a front opening 502 that has a diameter D1 that is larger than a diameter D2 of a centering portion 504 of the guide hole 208A. A tapered or conical portion 506 connects the front opening 502 to the centering portion 504.

The centering portion 504 can also include at least three centering ribs 510A, 510B, and 510C in one embodiment. The centering ribs 510A, 510B, and 510C are evenly distributed around an interior circumference of the centering portion. The three centering ribs 510A, 510B, and 510C can further aid in centering a guide pin in the centering portion 504 of the guide hole 208A. In an alternative embodiment, the guide pin can be a self-centering guide pin that includes centering structures (e.g., ribs, bumps, etc.) on the lengthwise portion of the guide pin. As the centering structures pass into the guide hole, the centering structures can automatically self-center the guide pin in the guide hole.

The three centering ribs 510A, 510B, and 510C can also be deformable so that the guide pin 602A is more accurately centered within the guide hole 208A as the guide pin is inserted into the guide hole. The alignment device 200 is intended to align a connector 302 to a corresponding receptacle so that the connector and receptacle can be easily and repeatedly engaged and disengaged. Therefore, the deformable centering ribs 510A, 510B, and 510C may be much smaller than non-deformable ribs so that the guide pin 602A cannot be too far from centered in the guide hole 208A. Deformable centering ribs 510A, 510B, and 510C can also be made from a resilient material (e.g., natural and synthetic rubber and other suitable polymers) that will substantially return to its original shape when the guide pin 602A is removed.

Figure 6A:
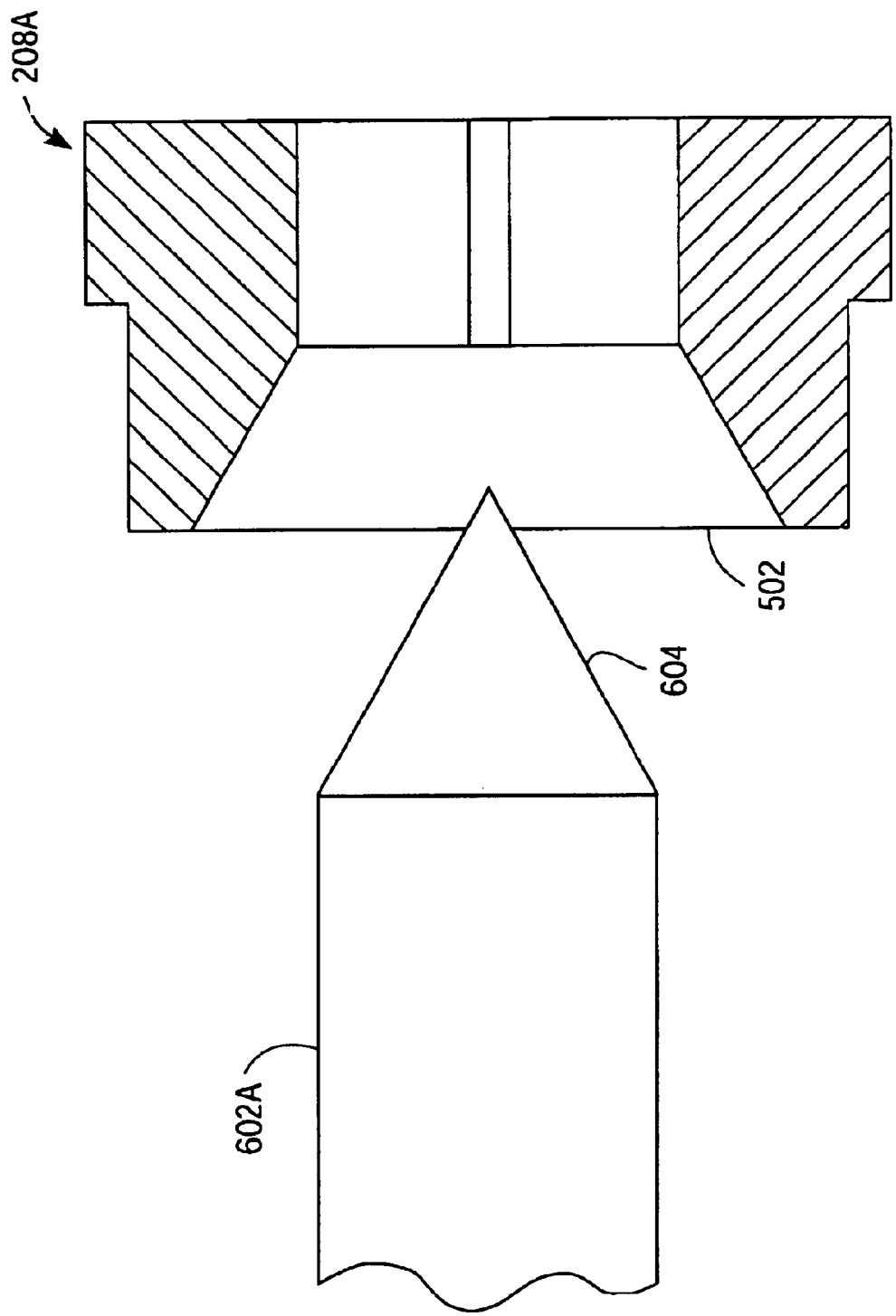
FIGS. 6A, 6B, 6C, and 6D sequentially show a guide pin being captured and centered in the guide hole.
Figure 6B:
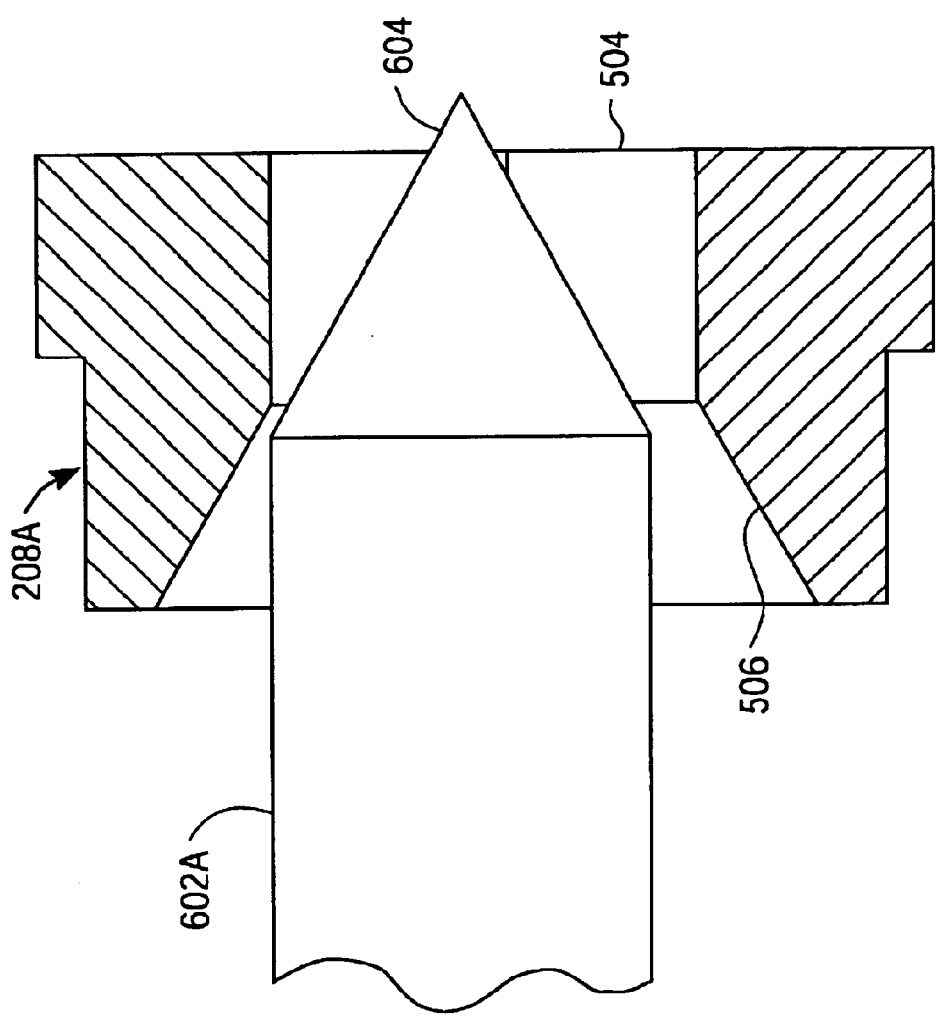
Figure 6D:
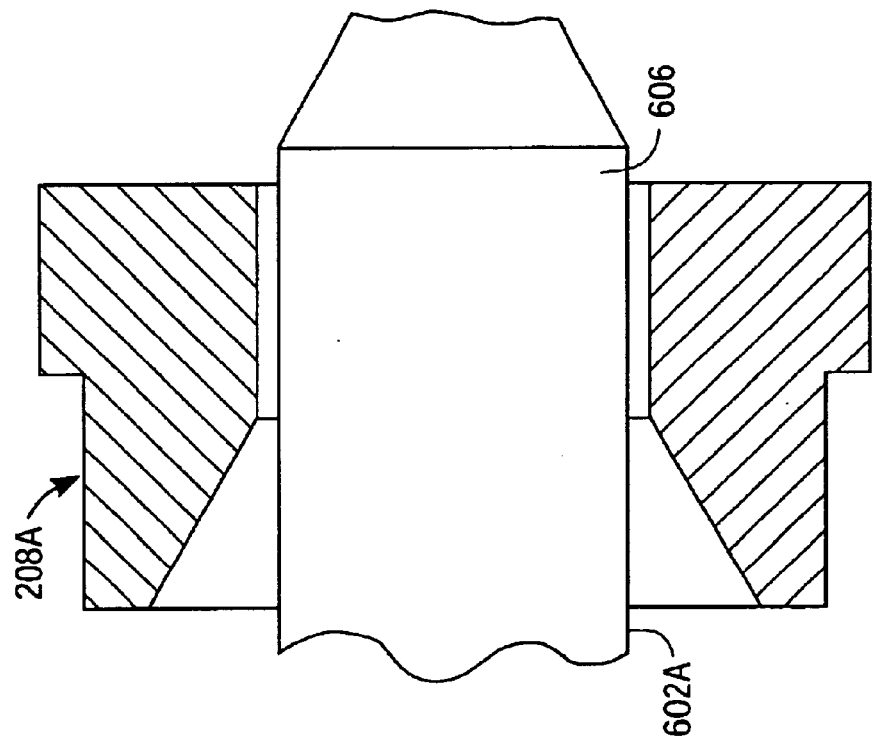
Figure 6C:
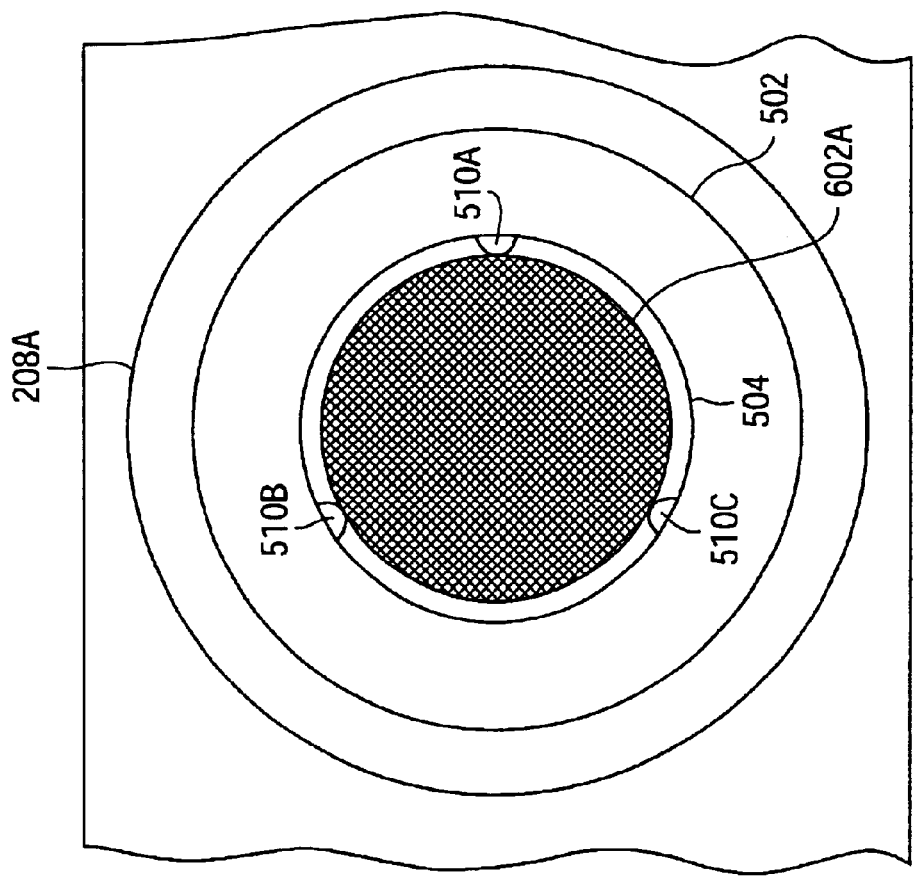

FIGS. 6A, 6B, 6C, and 6D sequentially show a guide pin 602A being captured and centered in the guide hole 208A. FIG. 6A shows a tapered portion 604 of the guide pin 602A entering or being captured in the front opening 502 of the guide hole 208A. FIG. 6B shows the tapered portion 604 of the guide pin 602A being guided toward being centered in the centering portion 504 by the tapered portion 506 of the guide hole 208A. FIGS. 6C and 6D show the guide pin 602A centered within the centering portion 504 of the guide hole 208A. The non-tapered portion 606 of the guide pin 602A is shown centered between the centering ribs 510A, 510B, and 510C.

Figure 7A:
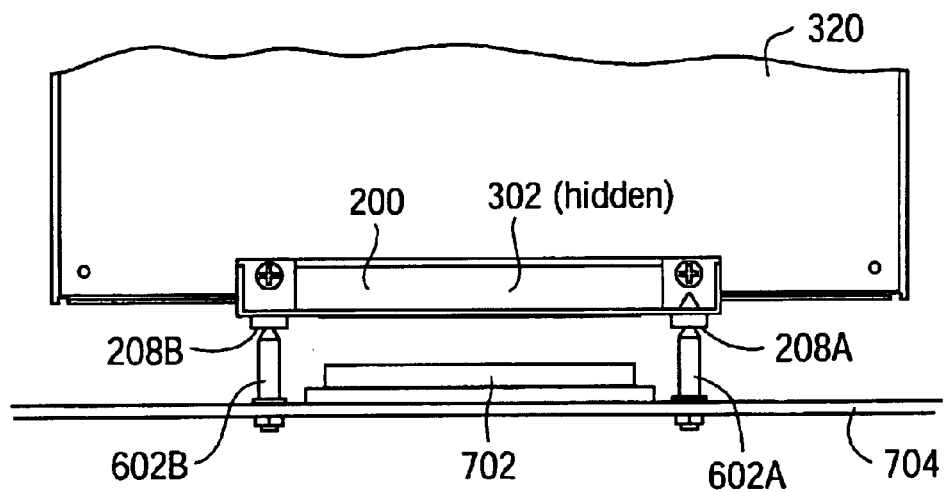
FIGS. 7A, 7B, and 7C sequentially show a pair of guide pins being captured and centered in the corresponding guide holes, in accordance with one embodiment of the present invention.
Figure 7B:
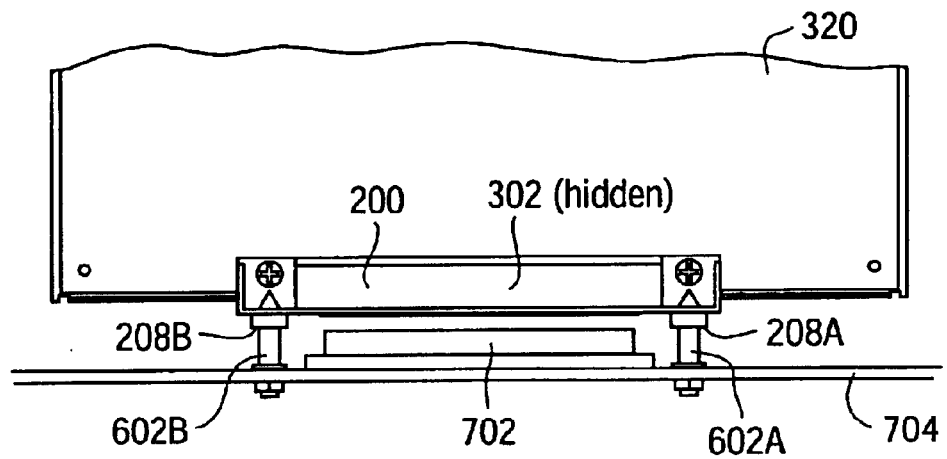
Figure 7C:
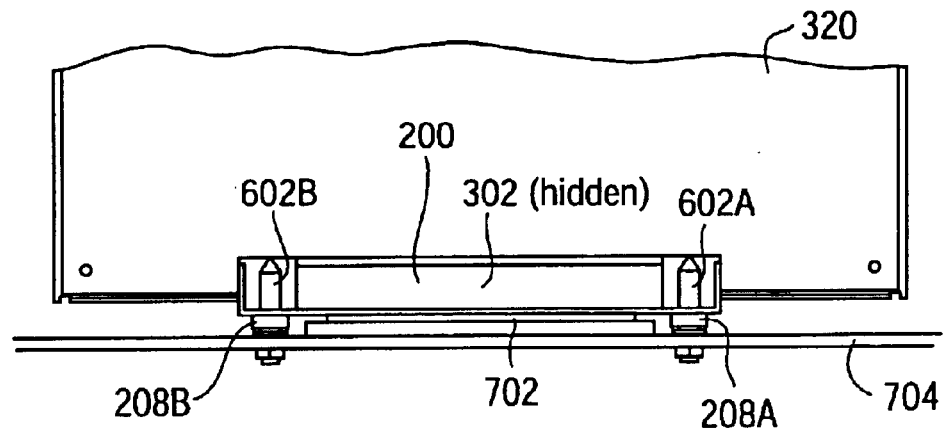

FIGS. 7A, 7B, and 7C sequentially show a sequence of a pair of guide pins 602A, 602B being captured and centered in the corresponding guide holes 208A, 208B in accordance with one embodiment of the present invention. FIG. 7A shows the guide pins 602A, 602B mounted to a mid plane 704. The guide pins 602A, 602B are located adjacent to a receptacle 702 that corresponds to the connector 302 (which is hidden from view in FIG. 7A) within the alignment device 200. The guide pins 602A, 602B are captured by the guide holes 208A, 208B, respectively, such as shown in FIGS. 6A and 6B above. FIG. 7B shows the guide pins 602A, 602B being centered by the guide holes 208A, 208B, respectively, such as shown in FIGS. 6C and 6D above.

The receptacle 702 does not begin to engage the connector 302 until after the guide pins 602A, 602B are centered in the guide holes 208A, 208B. Centering the guide pins 602A, 602B before the receptacle 702 engages the connector 302 ensures that the receptacle 702 and the connector 302 are properly aligned before beginning to engage. FIG. 7C shows the guide pins 602A, 602B fully centered and inserted in the guide holes 208A, 208B and the receptacle 702 and the connector 302 fully engaged.

Figure 8:
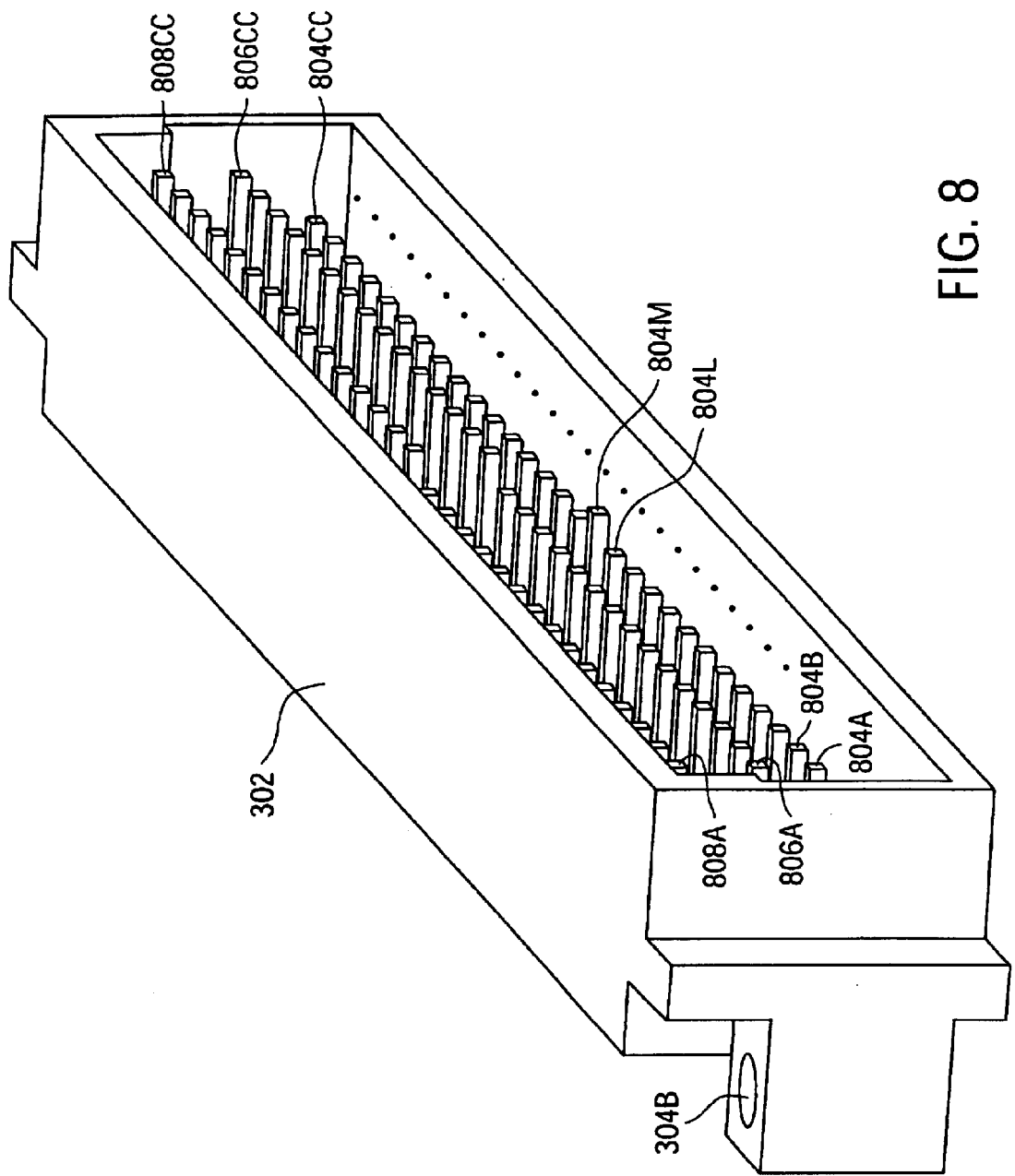
FIG. 8 shows a three-dimensional view of the connector, in accordance with one embodiment of the present invention.

FIG. 8 shows a three-dimensional view of the connector 302, in accordance with one embodiment of the present invention. The connector 302 includes multiple pins 804A–808CC. A pin 804M is longer than adjacent pins 806M, 808M. Connector 302 is an example of a legacy blind connector that is made for "hot swapping" (i.e., removing and replacing with power applied). When the connector is disconnected during a hot swap, the longer pin 804M will disconnect an electrical connection within the receptacle 702 (shown in FIGS. 7A–C) after the shorter, adjacent pins 806M, 808M. Conversely, the longer pin 804M will establish an electrical connection within the receptacle 702 before the shorter, adjacent pins 806M, 808M during installation/connection. As a result, varying the length of the pins 804A–808CC can allow for sequencing of the electrical connections during connection or disconnection. Unfortunately, the varying lengths of pins 804A–808CC also require more precise alignment of the connector 302 and the receptacle 702 so that the longer pins are not damaged during connection and disconnection.

Figure 9A:
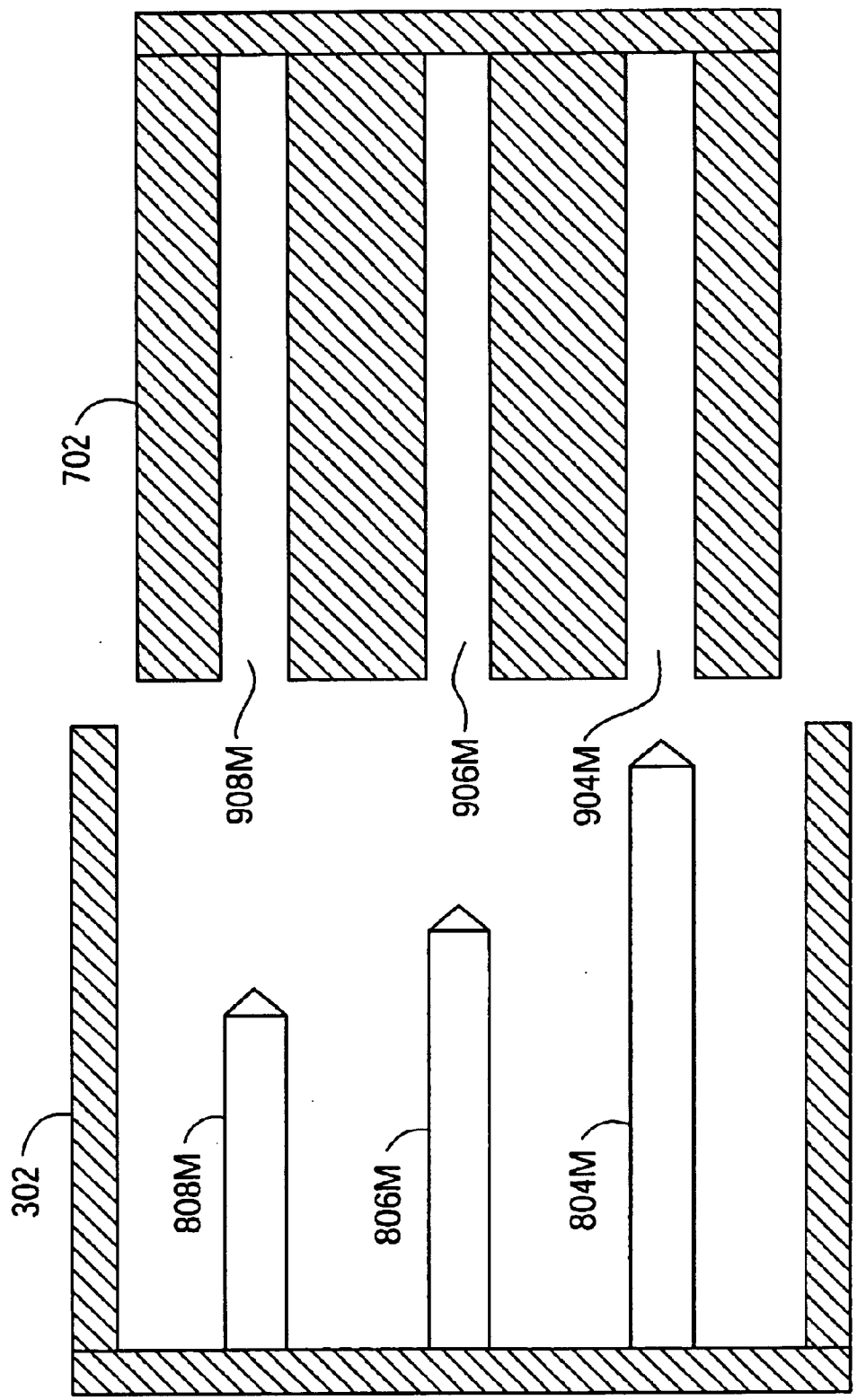
FIGS. 9A–9C sequentially show pins of varying length in the connector connecting in the receptacle, in accordance with one embodiment of the present invention.
Figure 9B:
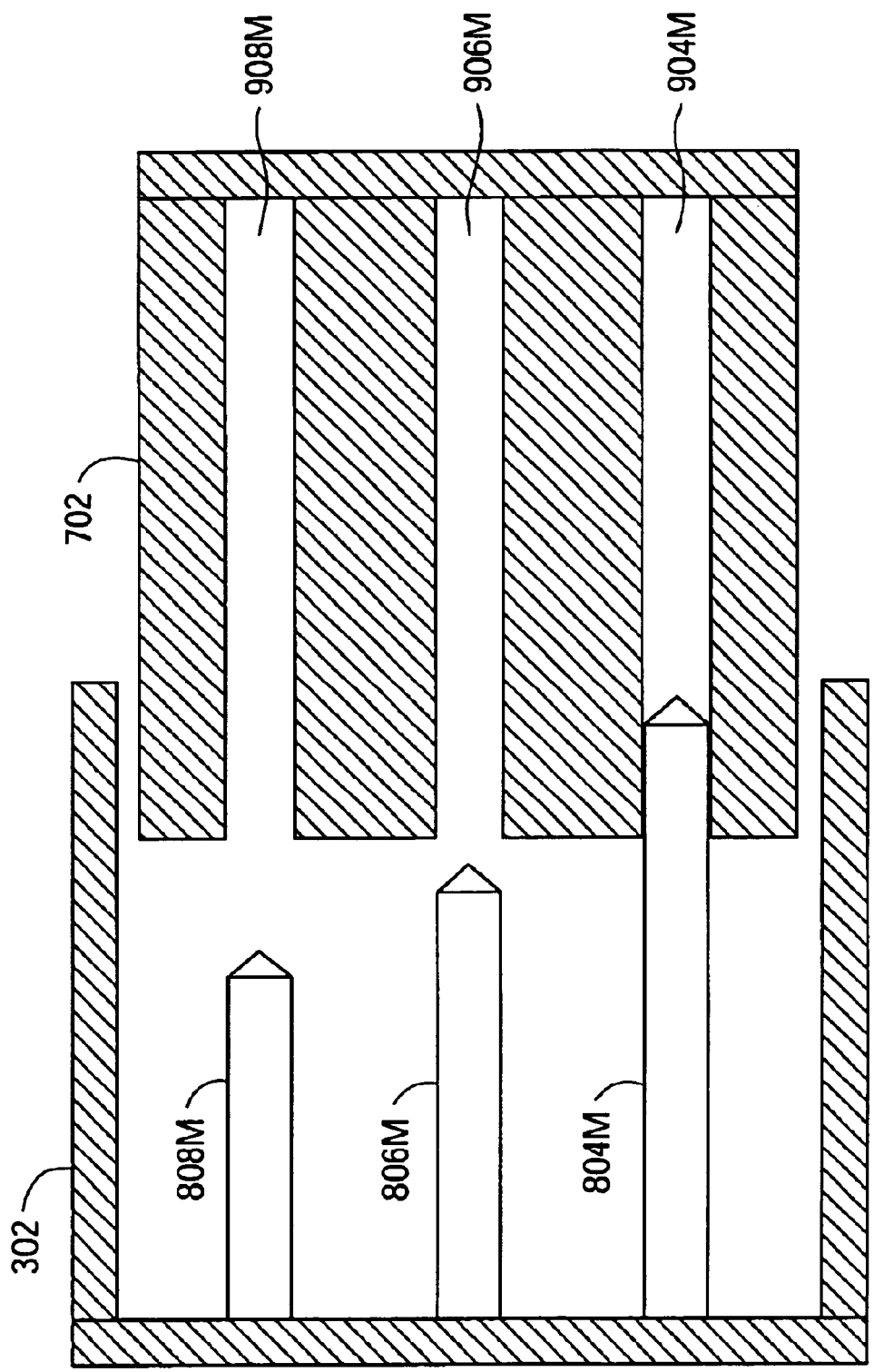
Figure 9C:
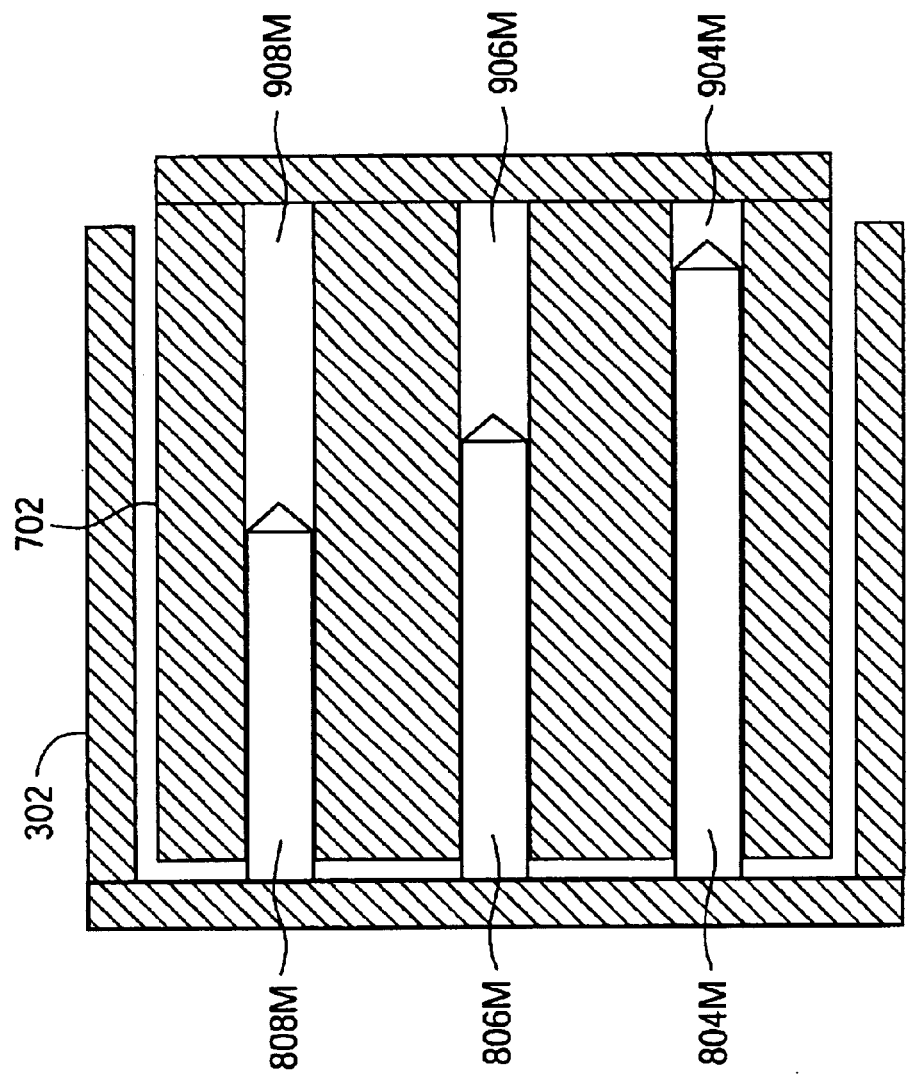

FIGS. 9A–9C sequentially show pins of varying length in the connector 302 connecting in the receptacle 702, in accordance with one embodiment of the present invention. In FIG. 9A, the connector 302 and the receptacle 702 are aligned because the guide pins 602A, 602B are centered within the alignment device 200, as shown in FIG. 7B above. As will be appreciated by those skilled in the art, if the connector 302 is not substantially aligned to the receptacle 702, then pin 804M can be easily bent or damaged.

FIG. 9B shows the connector 302 beginning to engage the receptacle 702 in that pin 804M has engaged the corresponding female socket 904M in the receptacle 702, while pins 806M and 808M have not yet engaged their respective female sockets 906M and 908M. As shown in FIG. 9B, if pin 804M is a ground pin in the connector 302 and pin 806M is a power connection, then pin 804M can establish a ground connection in the connector 302 before a power connection is established by pin 806M. Sequencing connections can be important for either hot swapping or to protect the electrical circuits from electrostatic discharge (ESD) damage.

FIG. 9C shows the connector 302 fully engaged with the receptacle 702. As shown therein, each of the pins 804M, 806M, and 808M is fully engaged to the respective female sockets 904M, 906M, and 908M in the receptacle 702.

Figure 10:
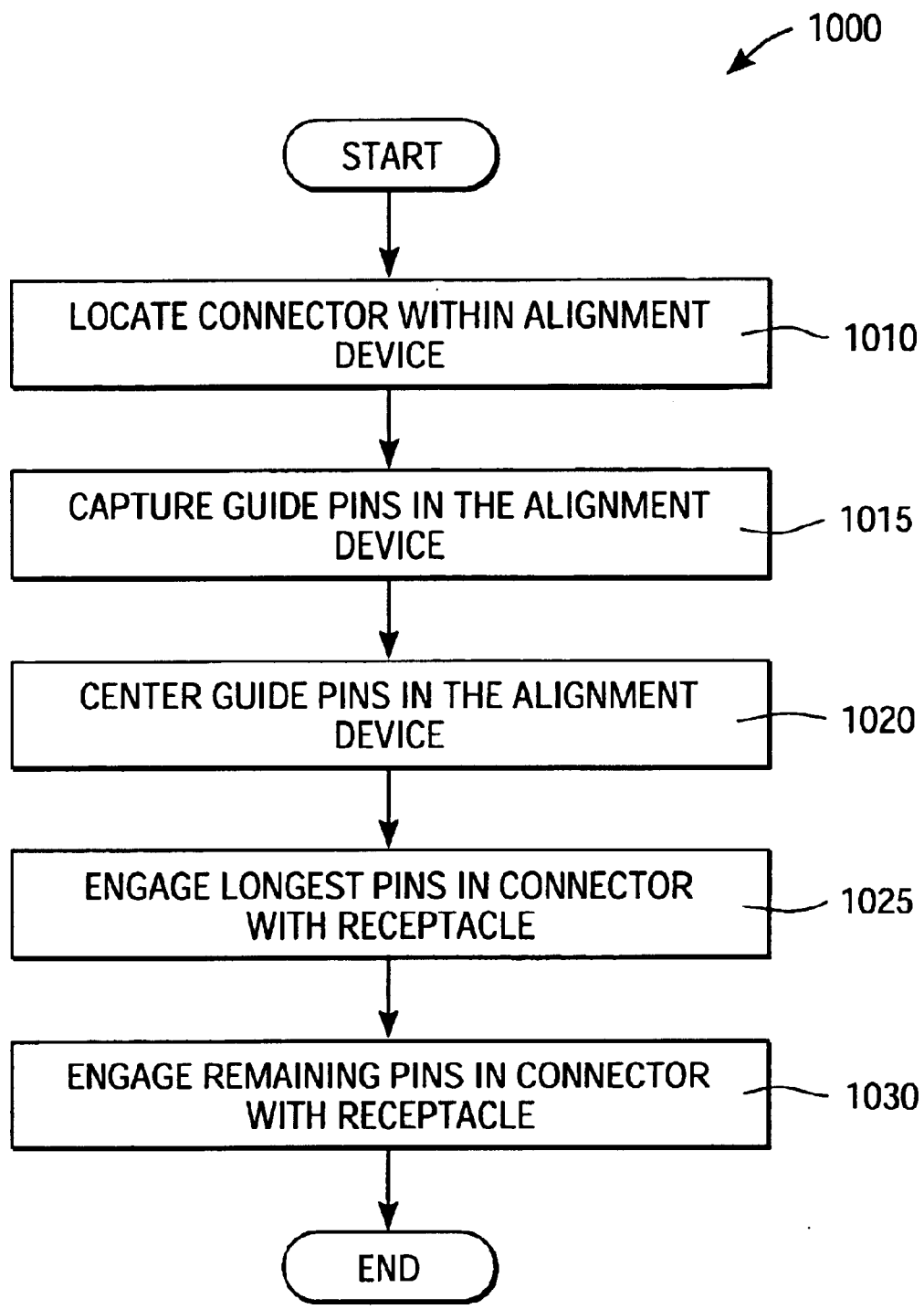
FIG. 10 is a flowchart of the method operations performed in aligning a connector with a receptacle in accordance with one embodiment of the present invention.

FIG. 10 is a flowchart 1000 of the method operations performed in aligning a connector 302 with a receptacle 702 in accordance with one embodiment of the present invention. In operation 1010, the connector 302 is located within the alignment device by, e.g., the connector alignment posts 210A, 210B described above. In operation 1015, the guide pins 602A, 602B are captured in the alignment device 200. After the guide pins 602A, 602B are captured in the alignment device 200, in operation 1020 the guide pins are centered in the alignment device. After the guide pins 602A, 602B are centered in the alignment device 200, in operation 1025 the connector 302 begins to engage the receptacle 702. When the connector 302 begins to engage the receptacle 702, the longer pin 804M establishes the first electrical connection to the receptacle 702. Next, in operation 1030, the remaining pins within the connector 302 establish electrical connections to the receptacle as the connector 302 further engages the receptacle. Finally, in operation 1035, the connector 302 and the receptacle 720 are fully engaged. Disconnecting the connector 302 and the receptacle 720 can occur in the reverse order of the operations 1010–1035 described above.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the specific details described herein, but may be modified within the scope and equivalents of the appended claims.

What is claimed is:

1. An alignment device comprising:
   a crossbar;
   two brackets, each one of the brackets including at least one guide hole, each guide hole having a front opening, the crossbar coupling the two brackets and defining a connector opening; and
   two connector alignment posts, each one of the connector alignment posts having a first end coupled to the crossbar and an opposing end protruding into the connector opening, wherein each guide hole includes at least three ribs substantially evenly distributed around an interior circumference of the guide hole and wherein the at least three ribs are deformable as a guide pin is inserted into the guide hole.

2. The alignment device of claim 1, wherein each guide hole is a self-centering guide hole.

3. The alignment device of 1, further comprising a self-centering guide pin capable of engaging the guide hole, the self-centering guide pin includes a plurality of centering ribs along the length of the self-centering guide pin.

4. The alignment device of claim 1, wherein the front opening of the guide hole includes a tapered section.

5. The alignment device of claim 1, wherein each one of the two brackets includes a mounting surface for securing the alignment device to a substrate.

6. The alignment device of claim 5, wherein the mounting surface includes one or more mounting holes capable of receiving a fastener to secure the alignment device to the substrate.

7. The alignment device of claim 6, wherein the one or more mounting holes is oriented perpendicularly to the guide holes.

8. The alignment device of claim 5, wherein the substrate is a circuit card.

9. An alignment device comprising:
   a crossbar;
   two brackets, each one of the brackets including at least one guide hole, each guide hole having a front opening, the crossbar coupling the two brackets and defining a connector opening; and
   two connector alignment posts, each one of the connector alignment posts having a first end coupled to the crossbar and an opposing end protruding into the connector opening, wherein the two connector alignment posts include a locking mechanism for engaging the alignment device to a connector.

10. An alignment device comprising:
    a crossbar;
    two brackets, each one of the brackets including at least one guide hole, each guide hole having a front opening, the crossbar coupling the two brackets and defining a connector opening; and
    two connector alignment posts, each one of the connector alignment posts having a first end coupled to the crossbar and an opposing end protruding into the connector opening, wherein the two connector alignment posts are self-centering alignment posts.

11. An alignment device comprising:
    a crossbar;
    two brackets, each one of the brackets including at least one guide hole, each guide hole having a front opening, the crossbar coupling the two brackets and defining a connector opening; and
    two connector alignment posts, each one of the connector alignment posts having a first end coupled to the crossbar and an opposing end protruding into the connector opening, wherein the first end of each one of the connector alignment posts has a larger diameter and the opposing end has a smaller diameter.

12. An alignment device comprising:

a crossbar;

two brackets, each one of the brackets including at least one guide hole, each guide hole having a front opening, the crossbar coupling the two brackets and defining a connector opening; and two connector alignment posts, each one of the connector alignment posts having a first end coupled to the crossbar and an opposing end protruding into the connector opening, wherein each one of the connector alignment posts includes three or more longitudinal ribs extending lengthwise along the connector alignment post, the three longitudinal ribs being substantially evenly distributed around the connector alignment post.

13. The alignment device of claim 12, wherein each of the three longitudinal ribs is deformable as the connector alignment post engages a corresponding alignment hole in the connector.

14. A method of connecting a circuit card to a mid plane comprising:

locating a connector in an alignment device, the connector being electrically coupled to the circuit card, and the alignment device being physically coupled to the circuit card, the alignment device including two guide holes and wherein each guide hole includes at least three ribs substantially evenly distributed around an interior circumference of the guide hole;

capturing two mid plane guide pins in the two guide holes in the alignment device, centering the two mid plane guide pins into the corresponding guide holes by deforming the at least three ribs as each guide pin is inserted into the corresponding guide hole; and connecting the connector to a corresponding receptacle in the midplane.

15. The method of claim 14, wherein locating the connector in the alignment device includes engaging at least one connector alignment post in a corresponding alignment hole in the connector.

16. The method of claim 15, wherein the at least one connector alignment post locks the connector to the alignment post.

17. A computer comprising:

a circuit card;

a connector;

an alignment device for locating the connector to the circuit card, the alignment device including:

a crossbar;

two brackets, each one of the two brackets including at least one guide hole, each guide hole having a front opening, the crossbar coupling the two brackets and defining a connector opening, the connector being contained within the connector opening, wherein each guide hole includes at least three ribs substantially evenly distributed around an interior circumference of the guide hole; and two connector alignment posts, each one of the connector alignment posts having a first end coupled to the crossbar and an opposing end protruding into a corresponding alignment hole in the connector; and a mid plane, the mid plane including:

a receptacle corresponding to the connector; and two guide pins corresponding to the two guide pin holes and wherein the at least three ribs are deformable as a guide pin is inserted into the guide hole.

* * * * *